United States Patent
Hanisch et al.

(10) Patent No.: US 9,986,648 B2
(45) Date of Patent: May 29, 2018

(54) HEATING ELEMENT FOR SMD MOUNTING

(71) Applicants: SIEMENS AKTIENGESELLSCHAFT, München (DE); KLEB- UND GIEβHARZTECHNIK DR. LUDECK GMBH, Vogelsdorf (DE)

(72) Inventors: Michael Hanisch, Hohen Neuendorf (DE); Heiko Huth, Rostock (DE); Wolfgang Ludeck, Berlin (DE); Bernd Mueller, Falkenberg (DE); Mathias Nowottnick, Rostock (DE); Andrey Prihodovsky, Bayreuth (DE); Dirk Seehase, Rostock (DE); Ulrich Wittreich, Velten (DE); Dirk Wormuth, Berlin (DE)

(73) Assignees: SIEMENS AKTIENGESELLSCHAFT, Munich (DE); KLEB-UND GIESSHARZTECHNIK DR. LUDECK GMBH, Vogelsdorf (DE)

( * ) Notice: Subject to any disclaimer, the term of this patent is extended or adjusted under 35 U.S.C. 154(b) by 0 days. days.

(21) Appl. No.: 15/561,338

(22) PCT Filed: Mar. 29, 2016

(86) PCT No.: PCT/EP2016/056775
§ 371 (c)(1),
(2) Date: Sep. 25, 2017

(87) PCT Pub. No.: WO2016/156299
PCT Pub. Date: Oct. 6, 2016

(65) Prior Publication Data
US 2018/0110131 A1    Apr. 19, 2018

(30) Foreign Application Priority Data
Mar. 31, 2015   (DE) .......................... 10 2015 205 820

(51) Int. Cl.
*H05K 3/34* (2006.01)
*H05K 1/18* (2006.01)
(Continued)

(52) U.S. Cl.
CPC .......... *H05K 3/341* (2013.01); *B23K 1/0006* (2013.01); *B23K 1/008* (2013.01); *B23K 1/0016* (2013.01);
(Continued)

(58) Field of Classification Search
CPC .............. B23K 1/0016; B23K 2201/42; H05K 2203/176
See application file for complete search history.

(56) References Cited

U.S. PATENT DOCUMENTS

| | | | |
|---|---|---|---|
| 3,220,630 A | 11/1965 | Bernard et al. | 228/44.3 |
| 2004/0149372 A1 | 8/2004 | Weihs et al. | 156/196 |
| 2011/0127314 A1 | 6/2011 | Heinrich et al. | 228/123.1 |

FOREIGN PATENT DOCUMENTS

| | | | |
|---|---|---|---|
| DE | 10131014 C1 | 9/2002 | G06K 19/073 |
| DE | 102008031633 A1 | 1/2010 | B23K 3/04 |

(Continued)

OTHER PUBLICATIONS

German Office Action, Application No. 102015205820.4, 7 pages, dated Feb. 19, 2016.
(Continued)

*Primary Examiner* — Michael C Miggins
(74) *Attorney, Agent, or Firm* — Slayden Grubert Beard PLLC

(57) ABSTRACT

The present disclosure relates to SMD mounting. The teachings thereof may be embodied in heating elements having a mounting side for SMD mounting, the mounting side being available for placing onto a substrate, for example in the form of a circuit carrier, electronic assemblies with a circuit
(Continued)

carrier and a component, and/or methods for producing an electronic assembly having a circuit carrier and a component placed on the circuit carrier. For example, a heating element may include: a mounting side for SMD mounting; a housing enclosing a cavity; and a reactive substance in the cavity that reacts exothermically at a reaction temperature $T_1$.

19 Claims, 3 Drawing Sheets

(51) Int. Cl.
  *B23K 1/00* (2006.01)
  *B23K 1/008* (2006.01)
  B23K 101/42 (2006.01)

(52) U.S. Cl.
  CPC .......... *H05K 1/181* (2013.01); *B23K 2201/42* (2013.01); *H05K 2203/176* (2013.01)

(56) References Cited

FOREIGN PATENT DOCUMENTS

| | | | | |
|---|---|---|---|---|
| DE | 102009013919 A1 | 7/2010 | ............. | B23K 35/24 |
| DE | 102010060831 A1 | 7/2011 | ............. | H01L 21/58 |
| DE | 102011116259 A1 | 4/2013 | ........... | G06K 19/077 |
| JP | 61111765 A | 5/1986 | ............... | B23K 1/00 |
| WO | 2016/156299 A1 | 10/1916 | ............... | B23K 1/00 |
| WO | 99/01250 A1 | 1/1999 | ............... | B23K 1/00 |

OTHER PUBLICATIONS

International Search Report and Written Opinion, Application No. PCT/EP2016/056775, 16 pages, dated Jun. 9, 2016.

HEATING ELEMENT FOR SMD MOUNTING

CROSS-REFERENCE TO RELATED APPLICATIONS

This application is a U.S. National Stage Application of International Application No. PCT/EP2016/056775 filed Mar. 29, 2016, which designates the United States of America, and claims priority to DE Application No. 10 2015 205 820.4 filed Mar. 31, 2015, the contents of which are hereby incorporated by reference in their entirety.

TECHNICAL FIELD

The present disclosure relates to SMD mounting. The teachings thereof may be embodied in heating elements having a mounting side for SMD mounting, the mounting side being available for placing onto a substrate, for example in the form of a circuit carrier, electronic assemblies with a circuit carrier and a component, and/or methods for producing an electronic assembly having a circuit carrier and a component placed on the circuit carrier.

BACKGROUND

Typical methods for producing electronic assemblies may use various thermal processes for producing the contacts between the circuit carrier and the components, in particular soldering processes. The thermal processes also cause thermal loading during production. To protect components that are particularly thermally sensitive, modified soldering processes, which for example proceed in a number of stages, therefore may be used. This causes additional production and assembly costs. A further problem arises if the electronic assembly to be produced is heterogeneous in its heat conducting properties and thermal capacity. If a thermal joining process is used for the contacts, varying degrees of heating within the electronic assembly then occur in the production device, such as for example the soldering furnace. This can lead to the formation of additional stresses, and consequently reduce the reliability of the electronic assembly produced. Although this effect can be counteracted by extending the heating times for the electronic assemblies to be produced, so the heat is distributed better across the assembly, this also results in longer throughput times in the production plant, whereby the cost-effectiveness of the process is reduced.

One way of improving the thermal characteristics, in addition to the heat applied by the production plant and introduced from outside into the electronic assembly to be produced, is to include a heat source that generates heat in the electrical assembly itself. For example, some include sheet-like components, such as printed circuit boards, with reactive foils which under certain conditions generate heat in the sheet-like component. An electronic assembly to be produced could in this way be heated up as it were from the inside out, while this heat could supplement the heat of the production device that is introduced from outside.

In some examples, a reactive soldering material is used as the material for the electrical contacts. Added to this material is a reactive component, which reacts exothermically at a reaction temperature, and thereby provides heat. This heat is directly available in the soldered connections to be formed, for which reason they are heated up more than the rest of the electronic assembly. The production device can therefore be operated at a lower temperature, the amount of heat that is present in the solder material being sufficient altogether to contribute to a melting of the solder. The reactive materials may transformed in the course of the exothermic reactions into a reaction product. This remains, at least in residues, on the circuit carrier or in the contact formed (e.g. the soldered connection). The quality of the result of production may be impaired.

SUMMARY

Disadvantages in known techniques may be avoided by using a different source of thermal energy instead of such reactive substances. For example, electrical heating elements including a heating wire can generate additional heat in the regions in question of the electronic assembly. The production of the heating wire may be taken into consideration and, on account of the necessity for electrical contacting, create an extra expenditure in production and assembly. The contacting must also be maintained while the electronic assembly is being moved in the production device, whereby the production expenditure increases further.

The teachings of the present disclosure may be embodied in a heating element for local heating of an electronic assembly with comparatively little production and assembly expenditure. Embodiments may include an electronic assembly designed so that local heating of the same is possible with comparatively little production and assembly expenditure. Further, embodiments may include a method for producing an electronic assembly in such a way that the assembly can be locally heated during the production process with comparatively little production and assembly expenditure.

In some embodiments, the heating element includes a housing which encloses a cavity in which a reactive substance is located. The substance reacts exothermically at a reaction temperature $T_1$. Subsequently, electrical contacts between the circuit carrier and the component are formed by an increase in temperature with respect to a characteristic joining temperature. The electrical contacts are typically soldered connections, the increase in temperature melting the solder material at the joining temperature. In this case, the joining temperature lies somewhat above the melting temperature of the solder material. However, other materials for forming the contact are also conceivable. For example, an electrically conductive adhesive that sets at the joining temperature may be used.

In some embodiments, there is a heating element having a mounting side (31) for SMD mounting, characterized in that the heating element has a housing (19) which encloses a cavity in which a reactive substance (33) that reacts exothermically at a reaction temperature $T_1$ is located.

In some embodiments, an opening (20) which connects the cavity to the surroundings of the heating element is provided in the housing.

In some embodiments, the reactive substance (33) is distributed in an open-pore matrix material (21).

In some embodiments, the reactive substance contains a metal-carbonyl compound.

In some embodiments, the reactive substance consists of a mixture containing a first substance and a second substance, it being possible for the two substances to react exothermically with oxygen independently of one another.

In some embodiments, admixed with the reactive substance is an oxidizing agent, in particular a peroxide, which gives off oxygen at said reaction temperature $T_1$.

In some embodiments, a fastening device for mounting on the electronic assembly (23) is provided on the housing (19).

In some embodiments, the fastening device comprises a pin (32) which protrudes from the mounting side (31) of the heating element.

In some embodiments, the cavity with the reactive substance (33) extends into the pin (32).

In some embodiments, there is an electronic assembly, comprising a circuit carrier (23) and a component (12), characterized in that a heating element (17) as claimed in one of the preceding claims is fastened on the electronic assembly.

In some embodiments, the heating element (17) is fastened on the circuit carrier (11) alongside the component.

In some embodiments, the circuit carrier (11) is configured in the form of a sheet, the component (12) is mounted on its front side and the heating element (17) is mounted on the rear side of the circuit carrier (11) in such a way that it is opposite from the component (12).

In some embodiments, the heating element (17) is in contact with a conducting path (16), the conducting path (16) conducting heat better than the circuit carrier (11), being in contact with the contacts (13) to be formed or the component (12) or, by interposing an insulating layer (27), adjoining the latter.

In some embodiments, the conducting path (16) consists entirely or partially of electrically conductive conductor tracks (29) for contacting the electrical contacts (13).

In some embodiments, there is a method for producing an electronic assembly (23), comprising a circuit carrier (23) and a component (12), the component (12) being placed on the circuit carrier (11) and electrical contacts (13) between the circuit carrier (11) and the component (12) being formed by an increase in temperature with respect to a joining temperature $T_3$, characterized in that, before the forming of the electrical contacts, a heating element (17) is fastened on the electronic assembly (23), which heating element has a cavity in which there is provided a reactive substance (33) that reacts exothermically at a reaction temperature $T_1$, the reaction temperature $T_1$ being less than the joining temperature $T_3$ and the heat of reaction resulting from the exothermic reaction being transferred from the heating element (17) to the electrical contacts (13) forming.

In some embodiments, after the forming of the electrical contacts (13), the heating element is removed from the electronic assembly.

In some embodiments, the increase in temperature when forming the electrical contacts (13) is produced in a soldering furnace.

In some embodiments, the heating element (17) on the circuit carrier (11) is used at a point of the electronic assembly that undergoes a lower increase in temperature in the soldering furnace than other points of the electronic assembly (23).

In some embodiments, the heating element (17) is used for heating up the electronic assembly (23) locally at a point where the component (12) is intended to replace a defective component.

In some embodiments, a heating element (17) as claimed in one of claims 1 to 9 or an assembly (23) as claimed in one of claims 10 to 15 is used.

BRIEF DESCRIPTION OF THE DRAWINGS

Further teachings are described below on the basis of the drawings. The same or corresponding drawing elements are respectively provided with the same designations and are only explained more than once to the extent that there are differences between the individual figures, in which.

DETAILED DESCRIPTION

Figure 1:
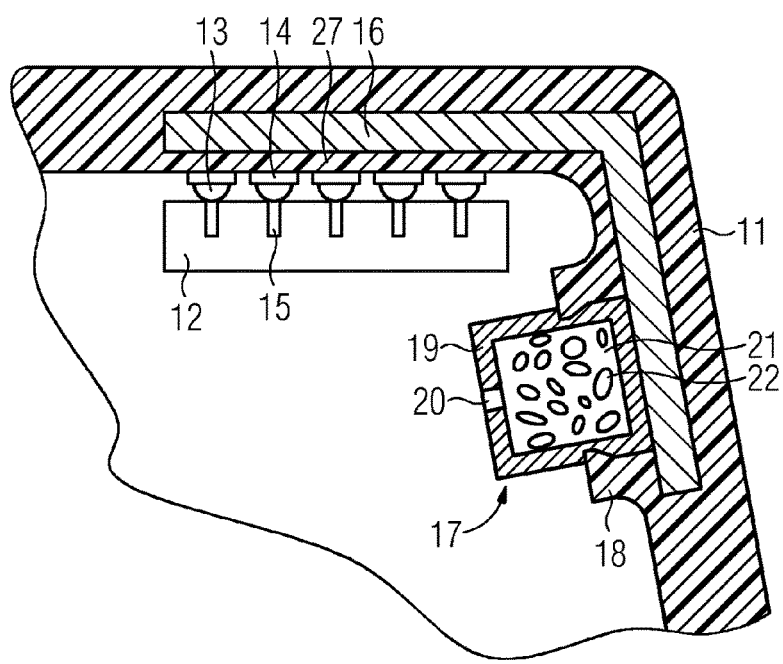
FIG. 1 shows an exemplary embodiment of the assembly according to the teachings of the present disclosure with an exemplary embodiment of the heating element, in section.

The heating element may be placed with its mounting side onto a circuit carrier. The usual production processes for SMD mounting can be used here. Since the circuit carrier must in any case be loaded with components, placement of the heating element can also be performed in the course of this component loading. This only entails a small increase in production and assembly expenditure. To integrate placement of the heating element in the usual component loading process for the electronic assembly, the heating elements may also be processed in the forms in which they are usually supplied. The heating elements may be taped or offered on trays, so that it is made easier for them to be gripped in the automatic component-loading machine.

In some embodiments, an electronic assembly may include the heating element described above placed in the course of a component-loading process. The heating element may for example be mounted in a region with a high thermal capacity, to avoid a longer required heating time in the production plant in comparison with other regions of the electronic assembly. In some embodiments, the heating element is in the vicinity of contacts to be formed, since there the heat is required for the thermal process for forming the contacts. Then, the rest of the electronic assembly does not have to be heated up so much, since the joining temperature $T_3$ does not have to be achieved just by the heat input from the production device into the electronic assembly to be produced.

In some embodiments, a method includes, before the forming of the electrical contacts, a heating element is fastened on the electronic assembly. This heating element has a cavity in which there is provided a reactive substance that reacts exothermically at a reaction temperature $T_1$. In some embodiments, the reaction temperature $T_1$ is less than the joining temperature $T_3$, at which the electrical contacts form. The heat of reaction resulting from the exothermic reaction of the reactive substance is transferred from the heating element to the electrical contacts forming. This is ensured by the electrical contacts being located in the region of thermal effect of the heating element.

In other words, the heating element is arranged sufficiently close to the electrical contacts to be formed that the heat produced in the heating element can be transferred to the electrical contacts to be formed. Less heat then has to be applied from the thermal joining process by the production device, for example the soldering furnace. How great the distance between the heating element and the electrical contacts to be formed is chosen in the particular application depending on the boundary conditions. The generated amount of heat of the heating element, the thermal conductivity of the structures that are located between the heating element and the contacts to be formed and the amount of the increase in temperature that is to be achieved with the heating element should be taken into consideration here. For example, it may be required that the increase in temperature in the contact elements that is brought about by the heating element is to be at least 10° C. or at least 5% of the joining temperature.

In some embodiments, a sufficient heat transfer can be ensured for example by the heating element being fastened on the circuit carrier alongside the component. In this way, the heat transfer between the component and the heating element is not disturbed by other components and can be realized over short connecting paths. In some embodiments, the arrangement of the heating element can be realized with sheet-like circuit carriers. In this case, the component may be mounted on the front side of the sheet-like circuit carrier and the heating element on the rear side of the circuit carrier, opposite from the component. By lying opposite, short heat transfer paths are likewise ensured, as in the case of the arrangement alongside.

In some embodiments, to improve the heat transfer further, the heating element is in contact with a conducting path. The conducting path is specifically designed to conduct heat better than the circuit carrier. In other words, the heat is transported from the heating element to the contacts to be formed more quickly over the conducting path. For this reason, the conducting path must be in contact with the contacts to be formed, or at least the component, and consequently indirectly the contacts to be formed. If the transfer of an electrical current is not desired, an electrical insulation layer may also be provided between the conducting path and the electrical contacts.

In some embodiments, the conducting path may be on the surface of the circuit carrier or lie within the circuit carrier. The arrangement of the conducting path on the surface is suitable in particular if the heating element is on the same side of the circuit carrier as the component. Conducting paths that run within the circuit carrier may be used to create a conducting path between a component on the front side of a sheet-like circuit carrier and a heating element on the rear side of this circuit carrier. In some embodiments, the electrically conductive conductor tracks for the contacting of the electrical contacts are also used as conducting paths. These are usually metallic and therefore have good thermal conductivity. If the heating element is thermally contacted by these conductor tracks, the heat can thus be introduced directly into the electrical contacts to be formed. The conductor tracks may in this case completely form the conducting path or be brought into thermal contact with a conducting path which is only intended for conducting heat, but is not involved in the formation of the electrical circuit. The heating elements according to the invention that are used are described in more detail below.

In some embodiments, an opening which connects the cavity to the surroundings of the heating element may be provided in the housing thereof. This is of advantage if a reactive substance that is found to produce gas when it undergoes exothermic reactions is used in the cavity. A pressure equalization with the surroundings can take place by way of the opening, so that the housing does not have to be of a pressure-resistant design. Furthermore, it can be achieved by way of the opening that an exothermic reaction with oxygen from the surroundings can take place when the oxygen enters the housing through the opening. In this way, the speed of the exothermic reactions can also be set by way of the size of the opening, since the supply of oxygen to the reactive substance depends on the cross section of the opening. This effect can be used primarily for exothermic reactions, which proceed in the cavity without producing gas and therefore do not generate a pressure above atmospheric pressure in the cavity.

In some embodiments, the reactive substance is distributed in a fine-pore matrix material. This allows a uniform distribution of the reactive substance in the cavity to be achieved. A pressure equalization or a supply of oxygen to the reactive substance is also possible by way of the open pores. The distribution of the reactive substance advantageously makes it possible to be able to apportion the production of heat better.

In some embodiments, the reactive component that can react exothermically with oxygen is in particular a metal-carbonyl compound. This group of substances has a melting point which can be set by a suitable modification of the chemical structure (the method described in DE 10 2009 013 919 A1 may be used for this). In this way, the reactive component can be advantageously tailor-made for the material of the electrical contact, in particular the solder material, with which it is to be used. Atmospheric oxygen can be made available for this. The fact that this atmospheric oxygen is consumed by the metal-carbonyl compound means that such a filler at the same time represents protection from oxidation for other components of the solder material. This dispenses with the need for carrying out the soldering process in an inert gas, such as for example nitrogen. This may create a further gain in cost-effectiveness.

In some embodiments, the reactive component consists of a mixture containing a first substance and a second substance, it being possible for the two substances to react exothermically with oxygen independently of one another. A more exact setting of the reactions proceeding during the soldering process is possible as a result. In some embodiments, the first substance is an initiator compound, in particular a metal-carbonyl compound, which has a lower temperature $T_1$ for decomposing the initiator compound than the second substance, with such a temperature $T_2$. So the first substance can act as an initiator compound, the decomposition of the first substance at the temperature $T_1$ must be sufficient to initiate an exothermic reaction of the second substance. Furthermore, it is possible that the decomposition products of the first substance react exothermically in a further reaction step. The exothermic reaction may take place with oxygen.

In some embodiments, the use of an initiator compound may allow the necessary heat input into the heating element for initiating a soldering process for example to be reduced further. This means that for example the process temperatures in a reflow soldering furnace can be lowered. The heat input during the soldering operation only has to achieve that the initiator compound reacts, whereby the chain reaction described above is set off, and in this way first the second substance reacts exothermically and, as a result, the solder material is melted.

In some embodiments, there is contained in the heating element an oxygen carrier, in particular a peroxide, which gives off oxygen at said temperature $T_1$ (or depending on the particular application at $T_2$). This may allow the oxygen necessary for the exothermic reaction to be made available directly in the heating element and in this way diffusion processes of the oxygen from the atmosphere into the interior of the heating element are not necessary. Furthermore, if it is necessary for other reasons, soldering can be performed in a protective atmosphere with the exclusion of oxygen, since the reactant for the exothermic reaction is made available within the heating element.

In some embodiments, a fastening device for mounting on the electronic assembly is provided on the housing of the heating element. Mechanical devices which can also make a releasable connection of the heating element on the circuit carrier or a component possible come into consideration here in particular. The dimensions of usual receptacles on circuit carriers may be taken into consideration here, so that it is possible to fall back on using standardized products and production processes. The placement of the heating element on the circuit carrier is also advantageously facilitated in this way.

For example, the fastening device may comprise a pin which protrudes from the mounting side of the heating element. This can then be inserted into a through-hole provided for it or else into a blind hole in the circuit carrier. A fit that ensures fixing of the heating element during the production process and allows subsequent separation of the heating element from the circuit carrier may be chosen here. The cavity with the reactive substance may extend into the pin. This may accelerate a transfer of heat by way of the pin into the circuit carrier. As a result, even greater amounts of heat can be transported by way of the circuit carrier to the contacts to be formed.

In some embodiments, the increase in temperature when forming the electrical contacts may be produced in a soldering furnace. In this case, soldered connections between the components and the circuit carrier are produced as electrical contacts. In some embodiments, at least one component is provided on the circuit carrier. However, usually a number of components are involved. In some embodiments, the heating element may be used for the introduction of heat into one of a number of components or else into a number of components. A number of heating elements may also be used.

The use of chemical compounds of a defined instability (specifically the reactive substance) in the soldering process has the effect of energy being released by an exothermic reaction. In this way, an increase in temperature occurs in the soldered connection during the chemical transformation. This form of energy release may reduce the required amount of heat supplied from the outside up until the melting of the solder. The reaction and the additional energy thereby achieved therefore remain locally restricted to the regions of the electrical contacts to be produced (soldered connections), and therefore have scarcely any effects on the reliability of the surrounding materials (printed circuit board, components). Consequently, lower thermal loading of the components is ensured, whereby the choice of components advantageously increases.

Furthermore, less heat is needed from the soldering furnace, whereby energy may be saved. In particular, as a result lead-free solder alloys, such as for example SnAgCu-based solder alloys, can be processed under conditions that have been customary for the SnPb solders used until now. At the same time, the usual soldering installations, base materials, components, and also repair systems can be used. Furthermore, by reducing the thermal loading during the soldering, the reliability of the assemblies, and consequently the service life of the assemblies produced, is increased, whereby problems of quality can be avoided. The quality of the soldered connections formed can be improved, since the oxidation of the soldered locations is also reduced by the lower thermal loading during the soldering. For this reason, it is also possible to dispense with the use of nitrogen during the soldering, which leads to further cost reductions.

The smaller amount of energy necessary also has the effect of shortening the soldering times, for which reason the throughput rates within an existing production line can be increased. As a result, a further gain in cost-effectiveness can be achieved. Repair processes can also be greatly simplified and shortened. Lowering the melting point of the solder material also has the effect that the use of printed circuit boards loaded with components on both sides is more reasonable. Since the melting point of the soldered connections formed is much higher than the process temperature, softening of the soldered connections on the front side of the printed circuit board when the soldered connections on the rear side are being produced in a second pass can be ruled out.

As already mentioned, the heating element of the circuit carrier may also be used at a point of the electronic assembly that undergoes a lower increase in temperature in the soldering furnace than other points of the electronic assembly. As a result, the electronic assembly undergoes more uniform heating, so that regions of the electronic assembly that heat up more quickly no longer become overheated.

Finally, methods incorporating teachings of the present disclosure may be used for carrying out repair soldering on an electronic assembly. For this purpose, a heating element is placed on the electronic assembly, it also being possible for mounting locations that were available for heating elements during the production process to be used here. The heating elements may be used both for the desoldering of a defective component and for the soldering of a replacement component. In the case of desoldering, the soldered connections are melted with the aid of the heat introduced by the heating element, so that it can be lifted off the circuit carrier. In the case of soldering of the new component, the heating element works in the way already described.

In FIG. 1, an electronic assembly is represented. A circuit carrier 11 consists of a housing, which is merely represented as a detail. In this housing, a component 12 is fastened on the inner wall, to be precise by means of contacts 13, which are formed as soldering points. For this, the circuit carrier has contact areas 14, the component 12 being placed with contact wires 15 onto the contact areas 14.

Provided within the circuit carrier 11 is a conducting path 16, which consists of copper and is therefore a good heat conductor. This conducting path is in contact with a heating element 17, which is releasably connected to the circuit carrier 11 in a receptacle 18. The fact that the heating element 17 is in contact with the conducting path 16 means that heat generated in the heating element can be transferred well to the conducting path 16. The conducting path 16 also extends under the contact areas 14, so that they can undergo heating by the conducting path. The material of the housing is of plastic, and is consequently electrically insulating, and forms between the contact areas 14 and the conducting path 16 a thin insulation layer 27 in comparison with the thickness of the conducting path 16.

The heating element 17 comprises a housing 19, which is provided with an opening 20. In a cavity formed by the housing there is an open-pore matrix material 21, in the pores 22 of which there is a reactive substance that is not represented any more specifically. The matrix material is an open-pore material, so that a pressure equalization can take place when the exothermic reaction of the reactive substance takes place, with gas being produced.

Figure 2:
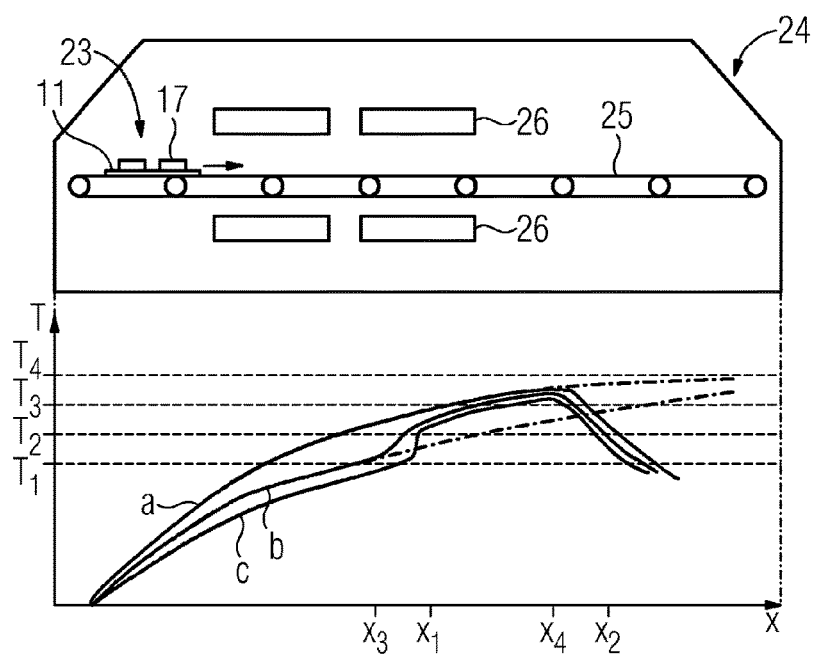
FIG. 2 shows an exemplary embodiment of the method according to the teachings of the present disclosure in a soldering furnace with a location-dependent (running variable x of the assembly) temperature profile (temperature T) assigned to said furnace.

In FIG. 2, an example method incorporating teachings of the present disclosure is represented, an assembly 23 being passed through a soldering furnace 24. For this purpose, a conveying device 25 is indicated, this passing the assembly 23 through the soldering furnace 24 at a constant speed. Also installed in the soldering furnace are radiant heaters 26, which heat the assembly.

The temperature profile T over a running variable x, which describes the path of the assembly 23 in the soldering furnace, is represented in a diagram under the soldering furnace 24 in FIG. 2, with the representation of the soldering furnace 24 itself. The curves a, b and c represent the temperature profile of different regions of the electronic assembly 23.

Curve a describes the temperature profile in a region of the circuit carrier 23 that has a low thermal capacity, and therefore heats up quickly. No heating elements are arranged in this region. It is evident that the temperature profile asymptotically approaches a process temperature $T_4$, which corresponds to the temperature prevailing in the soldering furnace. At the same time, the region also exceeds the joining temperature $T_3$ at the point $x_1$ of the soldering furnace that is necessary for the melting of the electrical contacts (soldered connections).

The temperature profile of a region with a greater thermal capacity is represented in curve b. If no heating elements were provided in this region, the temperature profile depicted by dash-dotted lines, extending from curve b, would be obtained, for which reason the joining temperature $T_3$ would be reached comparatively late at the point $x_2$. At this point in time, the region represented by curve a would already have been heated up too much and would have almost reached the process temperature $T_4$. To avoid this, the heating element is employed, so that when the reaction temperature $T_1$ of the reactive substance is exceeded at the position $x_3$ an additional heat input into the region of the electronic assembly takes place and the joining temperature $T_3$ is also achieved approximately at the position $x_1$, as is the case for the first-mentioned region (curve a).

The temperature profile according to curve c may be achieved if the reactive substance consists of two components. The first component, e.g. a metal-carbonyl compound, is used as an initiator, so that at the reaction temperature $T_1$ the temperature increases quickly and a reaction temperature $T_2$ of the second component is reached relatively quickly. The second component, e.g. an easily oxidizing metal, then produces the additional heat necessary, so that the region that is represented by curve c also reaches the joining temperature $T_3$ approximately at the position $x_1$.

Therefore, all of the soldered connections can be produced already at the point $x_1$. Shortly thereafter, the temperature can be reduced at the point $x_4$. There is consequently no thermal loading, which is represented by dash-dotted lines at the point $x_2$.

Figure 3:
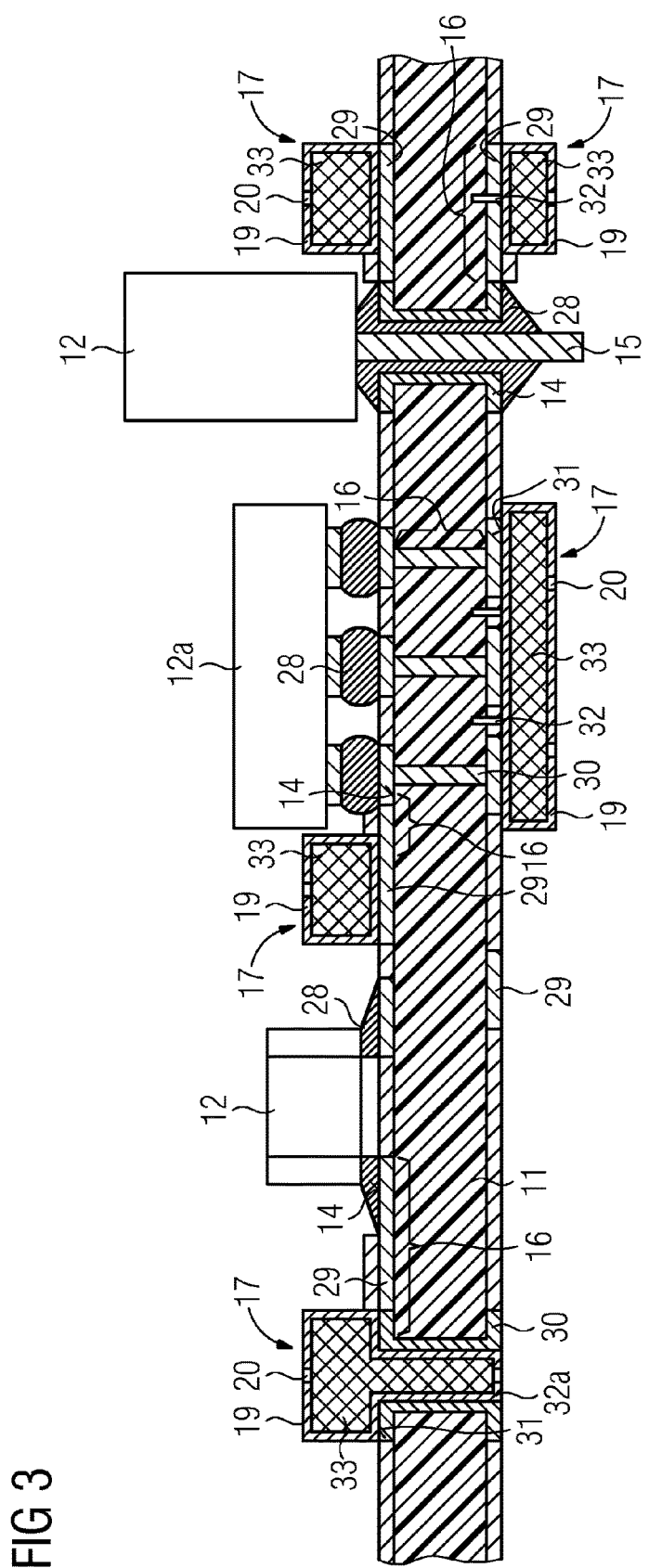
FIG. 3 shows another exemplary embodiment of the assembly according to the teachings of the present disclosure with exemplary embodiments of the heating element, in section.

In FIG. 3, a circuit carrier 11 in the form of a printed circuit board is represented. This has contact areas 14, on which solder depots 28 for the connection of the components 12 are provided. These solder depots 28 later form the contacts 13, as can be seen from FIG. 4. The contact areas 14 are also connected to conductor tracks 29, which are likewise indicated in FIG. 3. These are part of electrical circuits on the circuit carrier 11 that are not represented any more specifically. The contact areas 14, the conductor tracks 29 and vertical interconnect accesses 30 form the conducting paths 16 with good thermal conduction, at the one end of which in each case there are the heating elements 17 and at the other end of which in each case there are the solder depots 28, which from the later contacts 13 (compare FIG. 4).

In the case of the printed circuit board 11 represented in FIG. 3, the heating elements 17 have already been mounted.

For this purpose, they have on their mounting side 31 pins 32, which are inserted into holes (34 in FIG. 4) suitable for the purpose in the printed circuit board. The pin 32a is of a hollow form, so that a reactive substance 33 can also extend into the pin.

Figure 4:
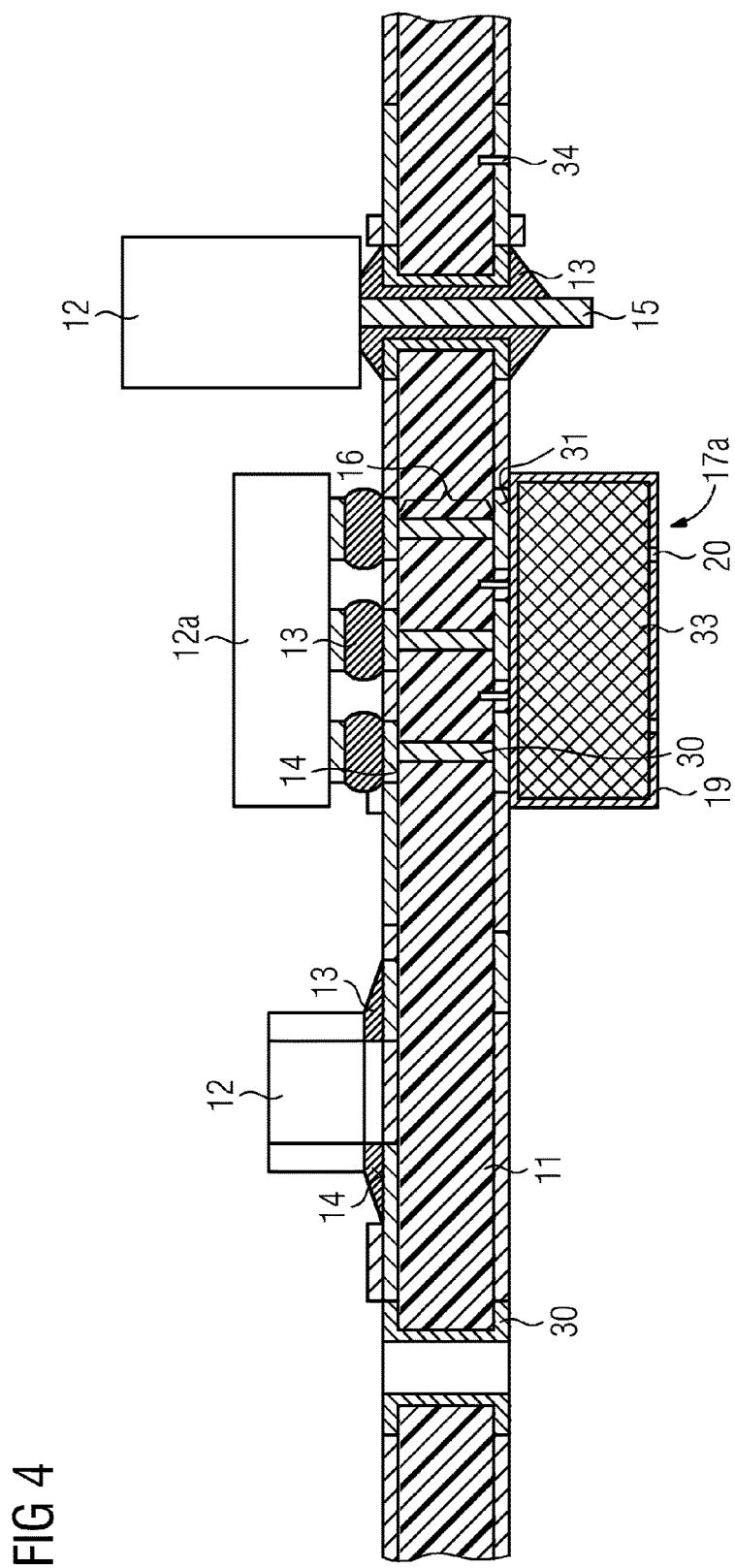
FIG. 4 shows the electronic assembly according to FIG. 3, prepared for repair soldering, in section.

In FIG. 4, the electronic assembly after production according to FIG. 3 is represented. The heating elements have been removed, while it is still possible to see a bore 34, into which one of the heating elements 17 has been inserted.

In FIG. 4, a structure for repair soldering can also be seen. The component 12a is to be desoldered, the contacts 13 having to be melted for this purpose. For this purpose, the heating element 17a is mounted on the side of the printed circuit board 11 that is opposite from the component 12a, the heat being sufficient to melt the soldered connections. In the same way, a replacement component can subsequently be soldered to the printed circuit board (not represented).

The repair soldering (desoldering of the defective component 12a and the soldering of a new component) may also be carried out in a furnace (not represented). This can make available part of the amount of heat required for the repair soldering, the temperatures prevailing in the soldering furnace having to be chosen to be low enough that the contacts 13 of the other components 12 remain intact. In this case, only the heat required to heat up more the region of the printed circuit board in which the component 12a to be exchanged lies has to be provided by the heating element 17a.

Of the many unstable organic and inorganic compounds that are suitable as a reactive substance, metal carbonyls are described more specifically. This class of compounds is distinguished by the presence of one or more metal atoms per mole, around which CO groupings are arranged according to the configuration of the electrons. Depending on the reaction conditions and the starting substances, so-called "homoleptic" (only one type of ligand) or "heteroleptic" (different types of ligand) carbonyl compounds are obtained. If different metals are used as central atoms, they are referred to as "isoleptic" carbonyls or complexes. Mononuclear compounds can thereby form, and can react further to form binary carbonyl compounds while producing energy. Production itself starts from a finely distributed metal or metal mixture, on which under appropriate conditions CO is directly adsorbed. The possibilities of using the corresponding halogen compounds for synthesis, which may be higher yield, have not been used because of possible impurities of the end products.

Nickel reacts readily with CO. At 80° C., the reaction takes place under normal pressure with a satisfactory yield. A rotating reaction vessel in which the axis is arranged horizontally may be used for this.

A representation of the reaction sequence is also given below in the example of a cobalt compound:

$$Co + 4CO \rightarrow Co(CO)_4$$

Since the mononuclear compound formed is relatively volatile and the intended application requires substances that are as stable as possible, but should have as far as possible a defined decomposition point of between 60° C. and 80° C., the binuclear and tetranuclear cobalt carbonyl were preferred. The representation is indicated below:

$$2Co(CO)_4 \rightarrow Co_2(CO)_8$$

The reaction takes place while energy is supplied, with or without solvent and under defined pressure conditions. The energy may be supplied by heat or UV exposure (thermolysis or photolysis). Depending on the metal used, the photolytic stability varies. For instance, carbonyls of Ru and Os are particularly unstable.

The dimer produced from the cobalt tetracarbonyl has a melting point of approximately 100° C., at which decomposition also takes place, which can be used for high-melting alloys.

Should the chosen carbonyl compound appear to be too reactive or the melting point too low for the particular application that is planned, it is possible to exchange the CO-ligand present on such compounds for other structures, for example cyclopentadiene, whereby a certain stabilization of the system takes place. The new compounds obtained exhibit a varying behavior of the kind referred to. Two examples of this are represented in FIGS. 5 and 6, the representations merely being considered as models, while the exact molecular structure has not yet been clarified definitively. If need be, further details of this would have to be determined experimentally, depending on the object to be achieved.

It has also been found in the tests conducted that energy is not given off suddenly in a very short space of time, but can be controlled by the chemical structure of the initiator used. The results achieved presuppose that the soldering process is performed in a normal oxygen-containing atmosphere and the opening in the housing of the heating element allows a sufficient supply of oxygen. The cross section of the opening can be used to apportion the production of heat. If it is desired to work in an inert gas atmosphere, the presence of a suitable oxygen carrier, such as for example the aforementioned peroxides, should be provided.

Metal powders are available as commercial products. Although oligomeric carbonyls are not known as commercial products, with the aid of literature references they can be made up by a person skilled in the art themselves.

What is claimed is:

1. A heating element comprising:
   a mounting side for SMD mounting;
   a housing enclosing a cavity; and
   a reactive substance in the cavity that reacts exothermically at a reaction temperature $T_1$.

2. The heating element as claimed in claim 1, wherein the reactive substance comprises a metal-carbonyl compound.

3. The heating element as claimed in claim 1, wherein the reactive substance comprises a mixture of a first substance and a second substance;
   wherein the two substances react exothermically with oxygen independently of one another.

4. The heating element as claimed in claim 1, further comprising an oxidizing agent admixed with the reactive substance, the oxidizing agent giving off oxygen at said reaction temperature $T_1$.

5. The heating element as claimed in claim 1, further comprising an opening connecting the cavity to surroundings of the heating element.

6. The heating element as claimed in claim 5, further comprising an open-pore matrix material; and
   wherein the reactive substance is distributed throughout the open-pore matrix material.

7. The heating element as claimed in claim 1, further comprising a fastening device on the housing for mounting on the electronic assembly.

8. The heating element as claimed in claim 7, wherein the fastening device comprises a pin protruding from the mounting side of the heating element.

9. The heating element as claimed in claim 8, wherein the cavity with the reactive substance extends into the pin.

10. An electronic assembly comprising:
    a circuit carrier;
    a component; and
    a fastened on the electronic assembly, the heating element comprising:
       a mounting side for SMD mounting;
       a housing enclosing a cavity; and
       a reactive substance in the cavity that reacts exothermically at a reaction temperature $T_1$.

11. The electronic assembly as claimed in claim 10, further comprising the heating element fastened on the circuit carrier alongside the component.

12. The electronic assembly as claimed in claim 11, wherein the circuit carrier comprises a sheet;
    the component is mounted on a front side of the sheet; and
    the heating element is mounted on a rear side of the sheet opposite from the component.

13. The electronic assembly as claimed in claim 10, further comprising a conducting path in contact with the heating element;
    the conducting path conducting heat better than the circuit carrier and in contact with the contacts to be formed or the component.

14. The electronic assembly as claimed in claim 13, wherein the conducting path comprises electrically conductive conductor tracks for contacting the electrical contacts.

15. A method for producing an electronic assembly with a circuit carrier and a component, the method comprising:
    placing the component on the circuit carrier;
    fastening a heating element on the electronic assembly;
    wherein the heating element includes a reactive substance reacting exothermically at a reaction temperature $T_1$ in a cavity of the heating element;
    transferring a heat of reaction from the exothermic reaction from the heating element to the electrical contacts; and
    forming electrical contacts between the circuit carrier and the component by increasing a temperature to a joining temperature $T_3$;
    wherein the reaction temperature $T_1$ is less than the joining temperature $T_3$.

16. The method as claimed in claim 15, further comprising, after the forming of the electrical contacts, removing the heating element from the electronic assembly.

17. The method as claimed in claim 15, further comprising using the heating element to heat up the electronic assembly locally at a point where the component is intended to replace a defective component.

18. The method as claimed in claim 15, further comprising generating the increase in temperature in a soldering furnace.

19. The method as claimed in claim 18, further comprising using the heating element on the circuit carrier at a point of the electronic assembly that undergoes a lower increase in temperature in the soldering furnace than other points of the electronic assembly.

* * * * *